United States Patent
Yang et al.

(10) Patent No.: US 9,520,726 B2
(45) Date of Patent: Dec. 13, 2016

(54) AUXILIARY DEVICE HAVING ENERGY HARVESTER AND ELECTRONIC DEVICE INCLUDING AUXILIARY DEVICE

(71) Applicant: SAMSUNG ELECTRONICS CO., LTD., Suwon-si (KR)

(72) Inventors: Jee-eun Yang, Uiwang-si (KR); Jin-wook Lee, Suwon-si (KR); Sung-young Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 399 days.

(21) Appl. No.: 14/272,116

(22) Filed: May 7, 2014

(65) Prior Publication Data
US 2015/0091528 A1   Apr. 2, 2015

(30) Foreign Application Priority Data
Sep. 27, 2013   (KR) .................. 10-2013-0115696

(51) Int. Cl.
*H02J 7/00*   (2006.01)
*H02N 2/18*   (2006.01)
*H01L 41/113*   (2006.01)

(52) U.S. Cl.
CPC .......... *H02J 7/0042* (2013.01); *H01L 41/1136* (2013.01); *H02J 7/0052* (2013.01); *H02N 2/186* (2013.01); *H02J 2007/0059* (2013.01)

(58) Field of Classification Search
CPC .... H01L 41/1136; H01L 41/1134; H02N 2/18; F23Q 3/002
USPC ........................................ 310/329, 330, 339
See application file for complete search history.

(56) References Cited

U.S. PATENT DOCUMENTS

| | | | |
|---|---|---|---|
| 8,030,825 B2 * | 10/2011 | Howarth | H01L 41/113 310/329 |
| 8,305,343 B2 | 11/2012 | Cheah et al. | |
| 8,354,778 B2 * | 1/2013 | Arnold | H02K 7/1892 310/370 |
| 8,836,674 B2 * | 9/2014 | Hsu | G06F 3/03545 345/179 |
| 2003/0063045 A1 * | 4/2003 | Fleming | G06F 3/03545 345/30 |
| 2007/0257491 A1 * | 11/2007 | Kornbluh | F03B 13/1845 290/53 |
| 2010/0194240 A1 | 8/2010 | Churchill et al. | |
| 2012/0154340 A1 * | 6/2012 | Vuppu | G06F 3/044 345/179 |

(Continued)

FOREIGN PATENT DOCUMENTS

| | | |
|---|---|---|
| JP | 6-4824 U | 1/1994 |
| JP | 8-036450 A | 2/1996 |

(Continued)

*Primary Examiner* — Derek Rosenau
*Assistant Examiner* — Bryan Gordon
(74) *Attorney, Agent, or Firm* — Sughrue Mion, PLLC

(57) ABSTRACT

An auxiliary device including an energy harvester and an electronic device including the auxiliary device are provided. The auxiliary device includes: a housing; a storage module which is moveable within the housing; and at least one piezoelectric transducer which disposed in the housing, such that a motion of the storage module causes a deformation of the piezoelectric transducer, thus generating electric energy. An end of the piezoelectric transducer may be fixedly connected to the storage module.

23 Claims, 5 Drawing Sheets

(56) References Cited

U.S. PATENT DOCUMENTS

2013/0141399 A1    6/2013  Cho et al.

FOREIGN PATENT DOCUMENTS

| JP | 9-081298 A | 3/1997 |
| JP | 2009-240086 A | 10/2009 |
| KR | 10-1063913 B1 | 9/2011 |
| KR | 10-1104229 B1 | 1/2012 |
| KR | 10-2013-0013914 A | 2/2013 |

* cited by examiner

AUXILIARY DEVICE HAVING ENERGY HARVESTER AND ELECTRONIC DEVICE INCLUDING AUXILIARY DEVICE

RELATED APPLICATION

This application claims priority from Korean Patent Application No. 10-2013-0115696, filed on Sep. 27, 2013, in the Korean Intellectual Property Office, the disclosure of which is incorporated herein in its entirety by reference.

BACKGROUND

1. Field

Apparatuses consistent with exemplary embodiments relate to an auxiliary device having an energy harvester and an electronic device including the auxiliary device.

2. Description of the Related Art

Piezoelectric energy harvesting technology is a green energy technology that converts mechanical energy (for example, vibrations, shocks, sounds, or the like) generated in the vicinity into electric energy by using a piezoelectric material and stores the electric energy. A representative example of a piezoelectric energy harvester is an energy harvester having a cantilever structure. An elastic body vibrates in the piezoelectric energy harvester having a cantilever to deform a piezoelectric element, thereby generating electric energy. Research has been done into a piezoelectric energy harvester that harvests large energy from small mechanical energy. If continuous external mechanical energy flows into the piezoelectric energy harvester, the piezoelectric energy harvester is not used as a power source. Therefore, a storage device such as a battery, a capacitor, or the like is required to store converted electric energy.

SUMMARY

One or more exemplary embodiments may provide an auxiliary device having an energy harvester and an electronic device including the auxiliary device.

Additional aspects will be set forth in part in the description which follows and, in part, will be apparent from the description, or may be learned by practice of the presented embodiments.

According to an aspect of an exemplary embodiment, an auxiliary device used for an electronic device, includes: a housing; a storage module which is moveable within the housing; and at least one piezoelectric transducer which is disposed in the housing, such that a movement of the storage module deforms the piezoelectric transducer, thereby generating electric energy. An end of the piezoelectric transducer may be fixed to the storage module. The electric energy generated by the piezoelectric transducer may be stored in the storage module.

The auxiliary device may include an input device of the electronic device.

The auxiliary device may include a stylus pen.

The auxiliary device may be provided in or outside the electronic device.

The auxiliary device may further include: at least one of a converter module which converts the electric energy generated by the piezoelectric transducer and stores the converted electric energy in the storage module, and a charger circuit module which charges a battery of the electronic device with the electric energy stored in the storage module.

At least one of the converter module and the charger circuit module may be connected to an end of the piezoelectric transducer.

The piezoelectric transducer may extend substantially parallel to a longitudinal direction of the housing, and the storage module may be connected to an end of the piezoelectric transducer.

When the storage module moves in a direction substantially perpendicular to the longitudinal direction of the housing, the piezoelectric transducer may be deformed.

The piezoelectric transducer may include a plurality of piezoelectric transducer portions, each having a different polarization direction.

The storage module may extend substantially parallel to the longitudinal direction of the housing, and the at least one piezoelectric transducer may be disposed between the storage module and the housing.

A first end of the piezoelectric transducer may be fixed, and a second end of the piezoelectric transducer may not be fixed.

When the storage module moves in the direction substantially perpendicular to the longitudinal direction of the housing, the piezoelectric transducer may be deformed.

According to an aspect of another exemplary embodiment, an electronic device includes an auxiliary device which is installed in or outside the electronic device. The auxiliary device may include: a housing; a storage module which is moveable within the housing; and at least one piezoelectric transducer which is disposed in the housing, such that a movement of the storage device causes a deformation of the piezoelectric transducer, thus generating electric energy. An end of the piezoelectric transducer may be connected to the storage module. The electric energy generated by the piezoelectric transducer may be stored in the storage module.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
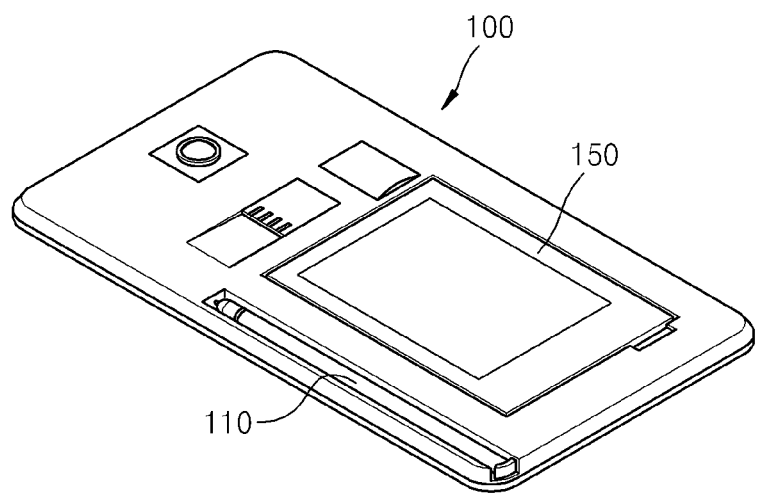
FIG. 1 is a view illustrating an electronic device according to an exemplary embodiment.

Exemplary embodiments will now be described more fully with reference to the accompanying drawings. The embodiments may, however, be embodied in many different forms and should not be construed as being limited to the specific arrangements described herein; rather, these embodiments are provided so that this disclosure will be thorough and complete, and will fully convey the concept of the present invention to those skilled in the art. In the drawings, the thicknesses of layers and regions are exaggerated for clarity.

FIG. 1 is a view illustrating an electronic device 100 according to an exemplary embodiment of the present invention. A back surface of an inside of the electronic device 100 is shown in FIG. 1.

Referring to FIG. 1, the electronic device 100 includes a battery 150, that supplies power to the electronic device 100, and an auxiliary device 110. The electronic device 100 may be any of various types of electronic devices that use the auxiliary device 110. For example, the electronic device 100 may be a mobile device such as a smart phone, a tablet PC, or the like. The auxiliary device 110 may include an input device that inputs data into the electronic device 100. For example, the auxiliary device 110 may include a stylus pen, a keyboard, a mouse, or any of various types of input devices. Hereinafter, a smart phone will be described as an example of the electronic device 100, and a stylus pen will be described as an example of the auxiliary device 110. As will be described later, the auxiliary device 110 includes an energy harvester that generates electric energy. The battery 150 of the electronic device 100 may be charged with the electric energy generated by the energy harvester. The auxiliary device 110 is provided on a side of the electronic device 100 as shown in FIG. 1, but may alternately be provided in any of various arrangements with respect to the electronic device 100. For example, the auxiliary device 110 may be provided on an outer surface of the electronic device 100.

Figure 2:
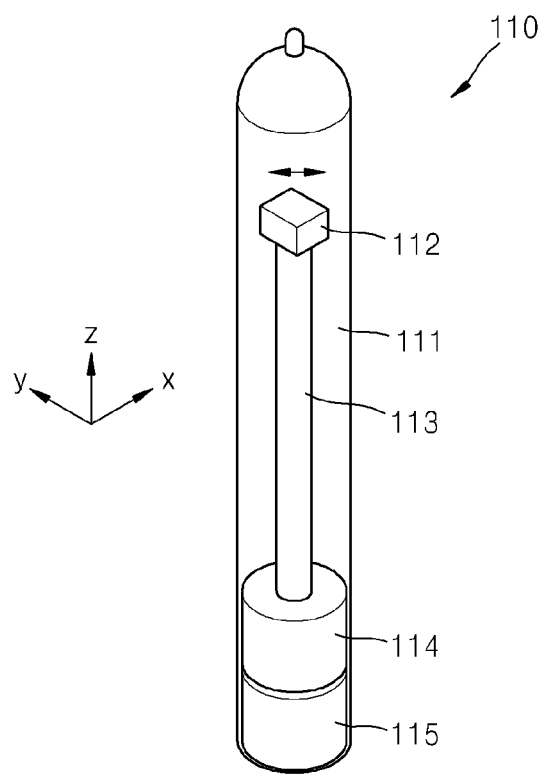
FIG. 2 is a view illustrating an inside of an auxiliary device including an energy harvester of FIG. 1.

FIG. 2 is a view illustrating an inside of the auxiliary device 110 of FIG. 1.

Referring to FIG. 2, the auxiliary device 110 includes a housing 111, a storage module 112 that is moveable within the housing 111, and a piezoelectric transducer 113 that is deformed by a motion of the storage module 112 to generate electric energy. The electric energy generated by the piezoelectric converter 113 may be stored in the storage module 112. The housing 111 operates as a frame of the auxiliary device 110 and may have a cylindrical shape. However, the housing 111 is not limited thereto and may have any of various shapes according to a function of the auxiliary device 110. The auxiliary device 110 may further include a converter module 114 and a charger circuit module 115 that are provided in the housing 111. The converter module 114 which converts the electric energy generated by the piezoelectric converter 113 and may include an analog-to-digital converter (ADC) or the like but is not limited thereto. The charger circuit module 115 charges the battery 150 of the electronic device 100 with the electric energy stored in the storage module 112. As shown in FIG. 2, the converter module 114 is provided underneath the piezoelectric transducer 113, and the charger circuit module 115 is provided underneath the converter module 114. However, the positions of the converter module 114 and the charger circuit module 115 are not limited thereto and these modules may be provided in any of various positions. Although not shown in the drawings, a circuit board, etc. is provided in the housing 111 to perform an input function as the auxiliary device 110.

The storage module 112 may store the electric energy generated by the piezoelectric transducer 113 and may also move within the housing 111 to operate as a mass that deforms the piezoelectric transducer 113. For this, the storage module 112 may be moveable within the housing 111 of the auxiliary device 110. In detail, the storage module 112 may be moveable in a direction substantially perpendicular to a longitudinal direction (a z direction in FIG. 2) of the housing 111. The storage module 112 may include a battery, a capacitor, or the like but is not limited thereto.

The piezoelectric transducer 113 is deformed by the motion of the storage module 112 to generate the electric energy. The electric energy generated by the piezoelectric transducer 113 may be temporarily stored in the storage module 112 and then may be charged into the battery 150 of the electronic device 100 through the charger circuit module 115. The piezoelectric transducer 113 may be provided in the housing 111 and may extend substantially parallel to the longitudinal direction of the housing 111. Here, the storage module 112 is positioned at a first end of the piezoelectric transducer 113 (e.g. an upper end of the piezoelectric transducer 113 in FIG. 2). A second end of the piezoelectric transducer 113 (e.g. a lower end of the piezoelectric transducer 113 in FIG. 2) is fixed to the converter module 114. Alternatively, the second end of the piezoelectric transducer 113 may fixed to the charger circuit module 115 or the housing 111. In a state in which the other end of the piezoelectric transducer 113 is fixed, and the storage module 112 installed on the first end of the piezoelectric transducer 113 is moved by an external force, the piezoelectric transducer 113 is deformed, and thus the electric energy is generated. The piezoelectric transducer 113 may include a piezoelectric material that generates electric energy through a deformation. The piezoelectric material may include an inorganic material or an organic material. For example, the piezoelectric material may include PZT, ZnO, SnO, PVDF, P(VDF-FrFE), or the like and may include any of various types of materials. The piezoelectric transducer 113 may include an elastic member having an elastic characteristic.

Figure 3:
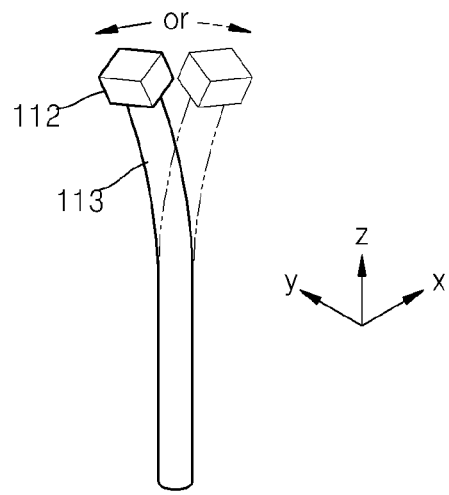
FIG. 3 is a view illustrating a piezoelectric transducer that is deformed according to a motion of a storage module of FIG. 2.

FIG. 3 is a view illustrating the piezoelectric transducer 113 that is deformed according to the motion of the storage module 112. Referring to FIG. 3, when the second end of the piezoelectric transducer 113 is fixed, and the storage module 112 installed on the first of the piezoelectric transducer 113 is moved in the direction (e.g. an x-direction or a y-direction in FIG. 3) substantially perpendicular to the longitudinal direction of the piezoelectric transducer 113 (e.g. a z direction in FIG. 3) by the external force, the piezoelectric transducer 113 is bent. And then, a piezoelectric potential is formed by the deformation of the piezoelectric transducer 113 to generate the electric energy. The piezoelectric transducer 113 has an elastic characteristic. Therefore, if the piezoelectric transducer 113 vibrates on a natural frequency, a time taken for generating the electric energy may be increased.

Figure 4:
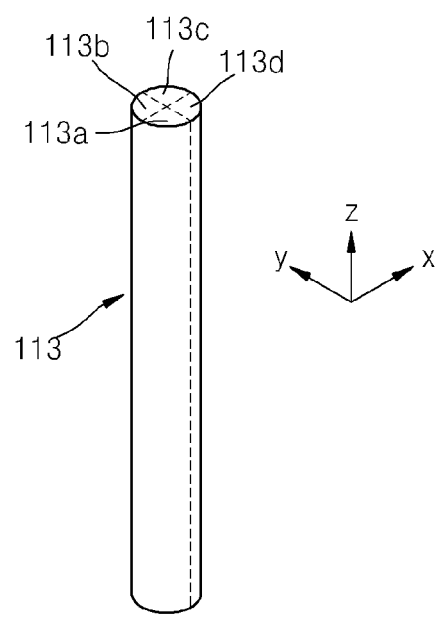
FIG. 4 is a perspective view of the piezoelectric transducer of FIG. 2.
Figure 5:
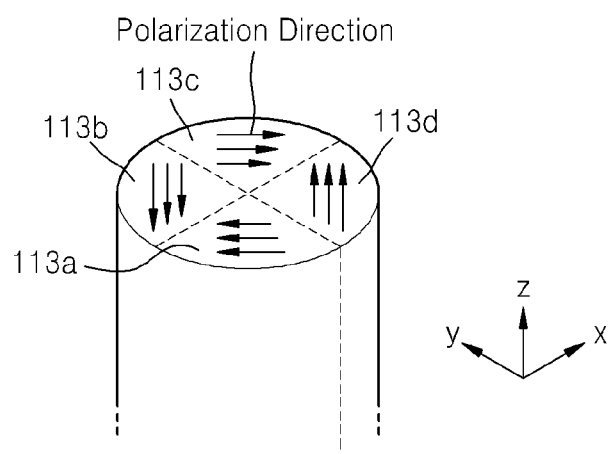
FIG. 5 is a view illustrating piezoelectric transducer portions of the piezoelectric transducer of FIG. 4 having different polarization directions.

FIG. 4 is a perspective view of the piezoelectric transducer 113 of FIG. 2. FIG. 5 is a view illustrating piezoelectric transducer portions 113a, 113b, 113c, and 113d of the piezoelectric transducer 113 of FIG. 4 having different polarization directions.

Referring to FIGS. 4 and 5, the piezoelectric transducer 113 may include four piezoelectric transducer portions 113a, 113b, 113c, and 113d that have different polarization directions in a plane (e.g. an x-y plane in FIGS. 4 and 5) perpendicular to a longitudinal direction of the piezoelectric transducer 113. As described above, if the piezoelectric transducer 113 includes the plurality of piezoelectric transducer portions 113a, 113b, 113c, and 113d having the different polarization directions, and the piezoelectric transducer 113 is deformed in a preset direction, the piezoelectric transducer portions 113a, 113b, 113c, and 113b having polarization directions corresponding to deformation directions may generate larger amounts of electric energy than the other piezoelectric transducer portions 113a, 113b, 113c, and 113d. Therefore, even if the piezoelectric transducer 113 is deformed in various directions, the piezoelectric transducer 113 may effectively generate electric energy. As shown in FIGS. 4 and 5, the piezoelectric transducer 113 includes the four piezoelectric transducer portions 113a, 113b, 113c, and 113d having the different polarization directions. However, the piezoelectric transducer 113 may include fewer or greater than four piezoelectric transducer portions having different polarization directions. The piezoelectric transducer 113 may include one single piezoelectric transducer portion having a preset polarization direction.

In the auxiliary device 110 having the above-described structure, in a state in which the auxiliary device 110 is separated from or installed in the electronic device 100, and a mechanical force such as vibrations or the like is applied to the auxiliary device 110 from an external source, the storage module 112 that operates as the mass moves in the housing 111 to deform the piezoelectric transducer 113. Here, the storage module 112 moves in a direction substantially perpendicular to a longitudinal direction of the auxiliary device 110, and the piezoelectric transducer 113 may, thereby, be deformed. As the piezoelectric transducer 113 is deformed as described above, electric energy is generated. The generated electric energy may be temporarily stored in the storage module 112 through the converter module 114. The electric energy stored in the storage module 112 may be charged into the battery 150 of the electronic device 100 through the charger circuit module 115. Therefore, a time taken for using the electronic device 100 may be increased.

In the above description, only the storage module 112 operates as the mass, but exemplary embodiments are not limited thereto. At least one of the converter module 114, the charger circuit module 115, and the storage module 112 may operate as masses. In this case, at least one of the converter module 114 and the charger circuit module 115 that operate as the masses may be installed at the first end of the piezoelectric transducer 113 together with the storage module 112. Also, in the above description, the converter module 114 and the charger circuit module 115 are provided in the housing 111 of the auxiliary device 110. However, one of the converter module 114 and the charger circuit module 115 may be provided in the housing 111 of the auxiliary device 110, and the other one of the converter module 114 and the charger circuit module 115 may be provided in the electronic device 100. Alternatively, both of the converter module 114 and the charger circuit module 115 may be provided in the electronic device 100.

As described above, in a state in which the auxiliary device 110 of the electronic device 100 is separated from or installed in the electronic device 100, and the mechanical force such as the vibrations, shocks, or the like is applied to the auxiliary device 110 from the external source, the storage module 112 that operates as the mass moves in the auxiliary device 110 to deform the piezoelectric transducer 113, thereby generating electric energy. Therefore, electric energy may be generated by using vibrations that are generated by using the auxiliary device 110 or moving the electronic device 100 in which the auxiliary device 110 is installed. The generated electric energy may be charged into the battery 150 of the electronic device 100 to increase the time taken for using the electronic device 100. Also, an opportunity to charge the battery 150 may be provided in an emergency state where the battery 150 is discharged.

Figure 6:
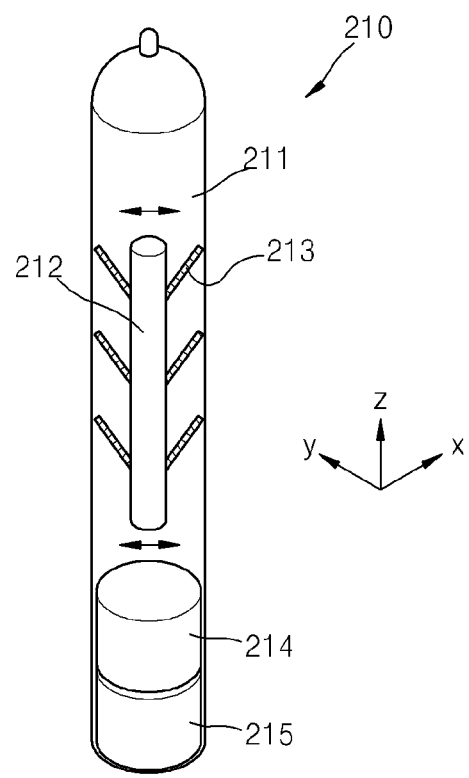
FIG. 6 is a view illustrating an inside of an auxiliary device including an energy harvester according to another exemplary embodiment.
Figure 7:
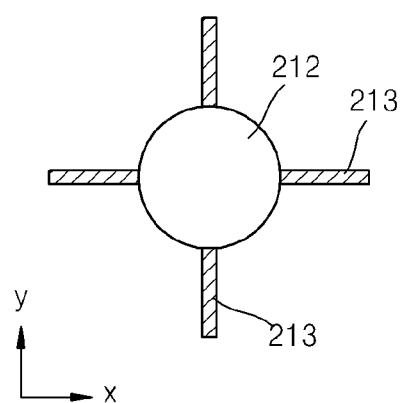
FIG. 7 is a plan view illustrating piezoelectric transducers that are provided on a storage module.

FIG. 6 is a view illustrating an inside of an auxiliary device 210 including an energy harvester according to another exemplary embodiment. FIG. 7 is a plan view illustrating piezoelectric transducers 213 that are provided on a storage module 212.

Referring to FIG. 6, the auxiliary device 210 includes a housing 211, the storage module 212 that is moveable within the housing 211, and a plurality of piezoelectric transducers 213 that are deformed by a motion of the storage module 212 to generate electric energy. The electric energy generated by the piezoelectric transducers 213 may be stored in the storage module 212. The housing 211 operates as a frame of the auxiliary device 210 and may have a cylindrical shape. However, the housing 211 is not limited thereto and may have any of various shapes according to a function of the auxiliary device 210. The auxiliary device 210 may further include a converter module 214 and a charger circuit module 215 that are provided in the housing 211. The converter module 214 converts the electric energy generated by the piezoelectric transducers 213, and the charger circuit module 215 charges the battery 150 of the electronic device 100 of FIG. 1 with the electric energy stored in the storage module 212. As shown in FIG. 6, the converter module 214 is provided under the storage module 212, and the charger circuit module 215 is provided under the converter module 214. However, the positions of the converter module 214 and the charger circuit module 215 are not limited thereto and may be provided in any of various positions. Although not shown in the drawings, a circuit board, etc. is provided in the housing 211 to perform an input function as the auxiliary device 210.

The storage module 212 may store the electric energy generated by the piezoelectric transducers 213 and operate as a mass that moves to deform the piezoelectric transducers 213. For this, the storage module 212 may be moveable within the housing 211 of the auxiliary device 210. In detail, in the present embodiment, the storage module 212 may be substantially parallel with a longitudinal direction of the housing 211. Here, the storage module 212 may be provided to move in a direction (e.g. an x direction or a y direction in FIG. 6) substantially perpendicular to the longitudinal direction (e.g. a z direction in FIG. 6) of the housing 211.

The piezoelectric transducers 213 are deformed by the motion of the storage module 212 to generate electric energy. The piezoelectric transducers 213 are provided between the storage module 212 and the housing 211. For example, the piezoelectric transducers 213 may extend, slantwise, between the storage module 212 and the housing 211. A first end of each of the piezoelectric transducers 213 is fixed onto an outer surface of the storage module 212, and a second end of each of the piezoelectric transducers 213 is not fixed. The second ends of the piezoelectric transducers 213 may contact an inner wall of the housing 211 or may be spaced apart from the inner wall of the housing 211. The piezoelectric transducers 213 may be arranged to extend radially from the outer surface of the storage module 212. In the plan view of FIG. 7, four piezoelectric transducers 213 are arranged symmetrically around the outer surface of the storage module 212. However, the various numbers of piezoelectric transducers 213 may be arranged on the storage module 212, and arrangements of the piezoelectric transducers 213 may be variously changed. Alternatively, only one piezoelectric transducer 213 may be provided on the storage module 212.

Figure 8:
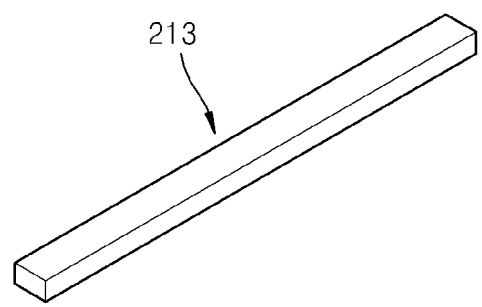
FIG. 8 is a perspective view of a piezoelectric transducer of FIG. 6.

FIG. 8 is a perspective view of a piezoelectric transducer 213. Referring to FIG. 8, the piezoelectric transducer 213 may have a beam shape. The piezoelectric transducer 213 may include a piezoelectric material that may be deformed to generate electric energy. The piezoelectric material may include an inorganic material or an organic material. For example, the piezoelectric material may include PZT, ZnO, SnO, PVDF, P(VDF-FrFE), or the like and may include any of various types of materials. The piezoelectric transducer 213 may include an elastic member having an elastic characteristic.

Figure 9:
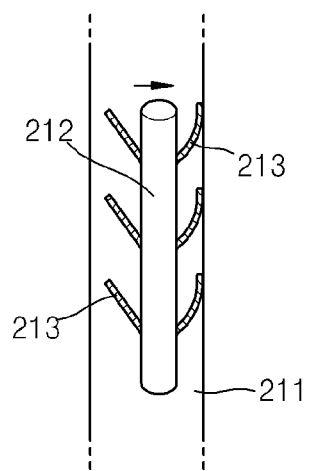
FIG. 9 is a view illustrating piezoelectric transducers that are deformed according to a motion of a storage module of FIG. 6.

FIG. 9 is a view illustrating piezoelectric transducers 213 that are deformed according to a motion of the storage module 212. Referring to FIG. 9, if the storage module 212 moves in a direction (e.g. an x direction or a y direction in FIG. 9) perpendicular to a longitudinal direction of the housing 211 (e.g. a z direction in FIG. 9) by an external force, some of the piezoelectric transducers 213 may contact an inner wall of the housing 211 and be deformed. Thus, a piezoelectric potential may be formed by the deformations of the piezoelectric transducers 213 to generate electric energy. The piezoelectric transducers 213 have elastic characteristics. Therefore, if the piezoelectric transducers 213 vibrate on a natural frequency, a time taken for generating the electric energy may be increased. The electric energy generated by the piezoelectric transducers 213 may be temporarily stored in the storage module 212 and then may be charged into the battery 150 of the electronic device 100 of FIG. 1 through the charger circuit module 215 that will be described later.

In the auxiliary device 210 having the above-described structure, in a state in which the auxiliary device 210 is separated from or installed in the electronic device 100 of FIG. 1, and a mechanical force such as vibrations or the like is applied to the auxiliary device 210 from an external source, the storage module 212 that operates as the mass moves in the housing 211 to deform the piezoelectric transducers 213. Here, the storage module 212 moves in a direction perpendicular to a longitudinal direction of the auxiliary device 210, and the piezoelectric transducers 213 may be deformed. As described above, the piezoelectric transducers 213 may be deformed to generate the electric energy. The generated electric energy may be temporarily stored in the storage module 212 through the converter module 214. The battery 150 of the electronic device 100 of FIG. 1 may be charged with the electric energy stored in the storage module 212 through the charger circuit module 215. Therefore, a time taken for using the electronic device 100 may be increased.

In the above description, first ends of the piezoelectric transducers 213 are fixed onto the storage module 212, and the second ends of the piezoelectric transducers 213 are not fixed. Alternatively, first ends of the piezoelectric transducers 213 may be fixed onto the inner wall of the housing 211 or another place other than the storage module 212, and the second ends of the piezoelectric transducers 213 may not be fixed. In this case, as the storage module 212 moves, a mechanical force may be applied to the second ends of the piezoelectric transducers 213 from the storage module 212 to generate electric energy. Alternately, there may be a mix of one or more piezoelectric transducers which are fixed to the storage module 212 and one or more piezoelectric transducers which are fixed to the housing 211 or another element.

Also, in the above description, only the storage module 212 operates as the mass, but exemplary embodiments are not limited thereto. At least one of the converter module 214, the charger circuit module 215, and the storage module 212 may operate as masses. In this case, at least one of the converter module 214 and the charger circuit module 215 that operates as the mass may be provided on the storage module 212. In the above description, the converter module 214 and the charger circuit module 215 are provided in the housing 211 of the auxiliary device 210. However, one of the converter module 214 and the charger circuit module 215 may be provided in the housing 211 of the auxiliary device 210, and the other one of the converter module 214 and the charger circuit module 215 may be provided in the electronic device 100. Alternatively, both of the converter module 214 and the charger circuit module 215 may be provided in the electronic device 100.

As described above, according to one or more exemplary embodiments, in a state in which an auxiliary device used for an electronic device is separated from or installed in the electronic device, and a mechanical force such as vibrations, shocks, or the like is applied to the auxiliary device from an external force, a storage module that operates as a mass may move in the auxiliary device. Therefore, a piezoelectric transducer may be deformed, and thus electric energy may be generated. Therefore, an energy generation may be possible by using vibrations that are generated by using the auxiliary device or moving the electronic device including the auxiliary device. A battery of the electronic device may be charged with the generated electric energy to increase a time taken for using the electronic device. Also, an opportunity to charge the battery may be provided in an emergency state where the battery of the electronic device is charged.

While one or more exemplary embodiments have been described with reference to the figures, it will be understood by those of ordinary skill in the art that various changes in form and details may be made therein without departing from the spirit and scope of the present invention as defined by the following claims.

What is claimed is:

1. An auxiliary device connectable to an electronic device, the auxiliary device comprising:
 a housing;
 a storage module which is moveable within the housing; and
 at least one piezoelectric transducer which is disposed within the housing, such that a motion of the storage module causes the at least one piezoelectric transducer to be deformed and thereby generate electric energy,
 wherein the storage module is configured to store electric energy generated by the at least one piezoelectric transducer.

2. The auxiliary device of claim 1, wherein the at least one piezoelectric transducer is fixedly connected to the storage module.

3. The auxiliary device of claim 1, wherein the auxiliary device comprises an input device of the electronic device.

4. The auxiliary device of claim 3, wherein the auxiliary device comprises a stylus pen.

5. The auxiliary device of claim 3, wherein the auxiliary device is configured to be disposed inside the electronic device or to be attached to an outside of the electronic device.

6. The auxiliary device of claim 1, further comprising at least one of:
 a converter module which converts the electric energy generated by the at least one piezoelectric transducer and stores the converted electric energy in the storage module, and a charger circuit module which charges a battery of the electronic device with the electric energy stored in the storage module.

7. The auxiliary device of claim 6, wherein at least one of the converter module and the charger circuit module is connected to an end of the at least one piezoelectric transducer.

8. The auxiliary device of claim 1, wherein the piezoelectric transducer extends substantially parallel to a longitudinal direction of the housing, and the storage module is connected to an end of the at least one piezoelectric transducer.

9. The auxiliary device of claim 8, wherein when the storage module is moveable in a direction substantially perpendicular to the longitudinal direction of the housing, the at least one piezoelectric transducer is deformed.

10. The auxiliary device of claim 8, wherein the at least one piezoelectric transducer comprises a plurality of piezoelectric transducer portions, wherein each of the plurality of piezoelectric transducer portions has a polarization direction different from polarization directions of the others of the plurality of piezoelectric transducer portions.

11. The auxiliary device of claim 1, wherein the storage module extends substantially parallel with a longitudinal direction of the housing, and the at least one piezoelectric transducer is disposed between the storage module and the housing.

12. The auxiliary device of claim 11, wherein a first end of the at least one piezoelectric transducer is fixed, and a second end of the piezoelectric transducer is freely moveable.

13. The auxiliary device of claim 12, wherein a movement of the storage module in the direction perpendicular to the longitudinal direction of the housing causes the piezoelectric transducer to be deformed.

14. An electronic system comprising:
an electronic device, and
an auxiliary device which is electrically connectable to the electronic device, the auxiliary device comprising:
a housing;
a storage module which is moveable within the housing; and
at least one piezoelectric transducer which is disposed within the housing, such that a motion of the storage module causes the at least one piezoelectric transducer to be deformed and thereby generate electric energy,
wherein the storage module is configured to store electric energy generated by the at least one piezoelectric transducer.

15. The electronic system of claim 14, wherein the at least one piezoelectric transducer is fixedly connected to the storage module.

16. The electronic system of claim 14, wherein the auxiliary device comprises an input device of the electronic device.

17. The electronic system of claim 14, wherein, upon connection of the auxiliary device to the electronic device and upon separation of the auxiliary device from the electronic device, the piezoelectric transducer is deformed and thereby generates electric energy due to a movement of the auxiliary device.

18. The electronic system of claim 14, wherein the auxiliary device further comprises at least one of:
a converter module which converts the electric energy generated by the at least one piezoelectric transducer and stores the converted electric energy in the storage module, and
a charger circuit module which charges a battery of the electronic device with the electric energy stored in the storage module.

19. The electronic system of claim 15, wherein the piezoelectric transducer extends substantially parallel to a longitudinal direction of the housing, and the storage module is connected at an end of the at least one piezoelectric transducer.

20. The electronic system of claim 19, wherein the at least one piezoelectric transducer comprises a plurality of piezoelectric transducer portions having different polarization directions.

21. The electronic system of claim 14, wherein the storage module extends substantially parallel to a longitudinal direction of the housing, and the at least one piezoelectric transducer is disposed between the storage module and the housing.

22. The electronic system of claim 19, wherein a first end of the at least one piezoelectric transducer is fixed, and a second end of the at least one piezoelectric transducer is freely moveable.

23. An electronic device comprising a battery and a removable auxiliary element, wherein the auxiliary element comprises:
a housing;
a storage module which is moveable within the housing;
a piezoelectric transducer disposed within the housing, such that a movement of the storage module causes a deformation of the piezoelectric transducer;
a converter module configured to convert an electric energy generated by the piezoelectric transducer and to store the electric energy in the storage module; and
a charger circuit configured to charge the battery with the electric energy stored in the storage module.

* * * * *